(12) United States Patent
Nene et al.

(10) Patent No.: US 8,271,567 B2
(45) Date of Patent: Sep. 18, 2012

(54) METHODS AND SYSTEMS FOR COMPRESSION, STORAGE, AND GENERATION OF DIGITAL FILTER COEFFICIENTS

(75) Inventors: Santosh Nene, Bangalore (IN); Giri N. K. Rangan, Bangalore (IN)

(73) Assignee: Intersil Americas Inc., Milpitas, CA (US)

( * ) Notice: Subject to any disclaimer, the term of this patent is extended or adjusted under 35 U.S.C. 154(b) by 1041 days.

(21) Appl. No.: 12/210,116

(22) Filed: Sep. 12, 2008

(65) Prior Publication Data

US 2009/0083354 A1 Mar. 26, 2009

Related U.S. Application Data

(60) Provisional application No. 60/975,386, filed on Sep. 26, 2007, provisional application No. 61/080,127, filed on Jul. 11, 2008.

(51) Int. Cl.
*G06F 17/10* (2006.01)
(52) U.S. Cl. ....................................................... 708/203
(58) Field of Classification Search .......................... None
See application file for complete search history.

(56) References Cited

U.S. PATENT DOCUMENTS

| | | | | |
|---|---|---|---|---|
| 5,309,381 A * | 5/1994 | Fukui | ............................. | 708/203 |
| 5,323,391 A * | 6/1994 | Harrison | ....................... | 370/210 |
| 5,367,674 A * | 11/1994 | Berk et al. | ..................... | 708/203 |
| 5,500,811 A | 3/1996 | Corry | | |
| 5,566,250 A * | 10/1996 | Coelho | ......................... | 382/276 |
| 5,603,022 A * | 2/1997 | Ng et al. | ....................... | 707/693 |
| 5,678,043 A * | 10/1997 | Ng et al. | ....................... | 707/693 |
| 6,427,157 B1 | 7/2002 | Webb | | |
| 6,457,032 B1 * | 9/2002 | Silver | ............................ | 708/315 |

FOREIGN PATENT DOCUMENTS

| | | |
|---|---|---|
| JP | 6077769 | 3/1994 |
| JP | 6090137 | 3/1994 |
| JP | 6188685 | 7/1994 |

* cited by examiner

*Primary Examiner* — David H Malzahn
(74) *Attorney, Agent, or Firm* — Fogg & Powers LLC

(57) ABSTRACT

A method and system for compressing coefficients of a digital filter is provided. In one approach, the method comprises providing a digital filter having a plurality of consecutive filter coefficients including a first filter coefficient, determining consecutive difference values between each of the consecutive filter coefficients, and storing the first filter coefficient and the consecutive difference values in a memory. The consecutive filter coefficients are generated by retrieving the first filter coefficient, and adding a first difference value to the first filter coefficient to generate a consecutive second filter coefficient. The first difference value corresponds to a difference between the first filter coefficient and the second filter coefficient. A consecutive next difference value is then added to the second filter coefficient to generate a consecutive next filter coefficient. The consecutive next difference value corresponds to a difference between the second filter coefficient and the consecutive next filter coefficient.

10 Claims, 4 Drawing Sheets

US 8,271,567 B2

METHODS AND SYSTEMS FOR COMPRESSION, STORAGE, AND GENERATION OF DIGITAL FILTER COEFFICIENTS

This application claims the benefit of priority to U.S. Provisional Patent Application Ser. No. 60/975,386, filed on Sep. 26, 2007, the disclosure of which is incorporated herein by reference.

This application also claims the benefit of priority to U.S. Provisional Patent Application Ser. No. 61/080,127, filed on Jul. 11, 2008, the disclosure of which is incorporated herein by reference.

BACKGROUND

When filters are implemented in integrated circuits, the filter coefficients are stored in memory such as a read-only memory (ROM). The depth of the ROM is equal to the number of coefficients and the width of the ROM is equal to the bit-width of the coefficients. Lower quantization noise means larger bit-widths, which in turn mean a larger ROM area is required.

In high precision digital signal processing (DSP) systems using finite impulse response (FIR) filters, the coefficients of the FIR filters may need to be stored to a higher precision, and a large number of coefficients may be required to be stored. This leads to longer bit-widths and higher storage requirements. The storage requirement increases further with an increasing number of taps in each filter.

For example, if the signal-to-noise ratio (SNR) at the output of an FIR filter is high, each of the filter coefficients needs to be stored at higher precision. Such higher precision storage requires larger bit-widths for storing the coefficients. For high precision sigma-delta converters, the bit-widths can be significantly large (often more than 20 bits). Storing large numbers of high precision coefficients can take up a significant area on a silicon chip.

For the reasons stated above and for other reasons that will become apparent to those skilled in the art upon reading and understanding the present specification, there is a need for reducing the area in a silicon chip required to store digital filter coefficients.

SUMMARY

The present invention relates to a method and system for compressing coefficients of a digital filter. In one approach, the method comprises providing a digital filter having a plurality of consecutive filter coefficients including a first filter coefficient, determining consecutive difference values between each of the consecutive filter coefficients, and storing data comprising the first filter coefficient and the consecutive difference values in a memory. The consecutive filter coefficients are generated by retrieving the first filter coefficient, and adding a first difference value to the first filter coefficient to generate a consecutive second filter coefficient. The first difference value corresponds to a difference between the first filter coefficient and the second filter coefficient. A consecutive next difference value is then added to the second filter coefficient to generate a consecutive next filter coefficient. The consecutive next difference value corresponds to a difference between the second filter coefficient and the consecutive next filter coefficient.

BRIEF DESCRIPTION OF THE DRAWINGS

Features of the present invention will become apparent to those skilled in the art from the following description with reference to the drawings. Understanding that the drawings depict only typical embodiments of the invention and are not therefore to be considered limiting in scope, the invention will be described with additional specificity and detail through the use of the accompanying drawings, in which.

DETAILED DESCRIPTION

In the following detailed description, reference is made to the accompanying drawings, which form a part hereof, and in which is shown by way of illustration specific embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense, and the scope of the present invention is defined only by the claims and equivalents thereof.

The present invention is directed to methods and systems for compression, storage, and generation of digital filter coefficients. The present methods and systems provide for more efficient storage and retrieval of a large number of digital filter coefficients, such as finite impulse response (FIR) coefficients. Embodiments of the present invention make use of the fact that differences between consecutive coefficients are much smaller than the coefficients themselves. The present embodiments reduce the bit-width of a memory such as a ROM significantly, since, instead of storing coefficients, the difference values between consecutive coefficients are stored. The storage of difference values results in a significant reduction of the area on a silicon chip used for storage of coefficient information.

Figure 1:
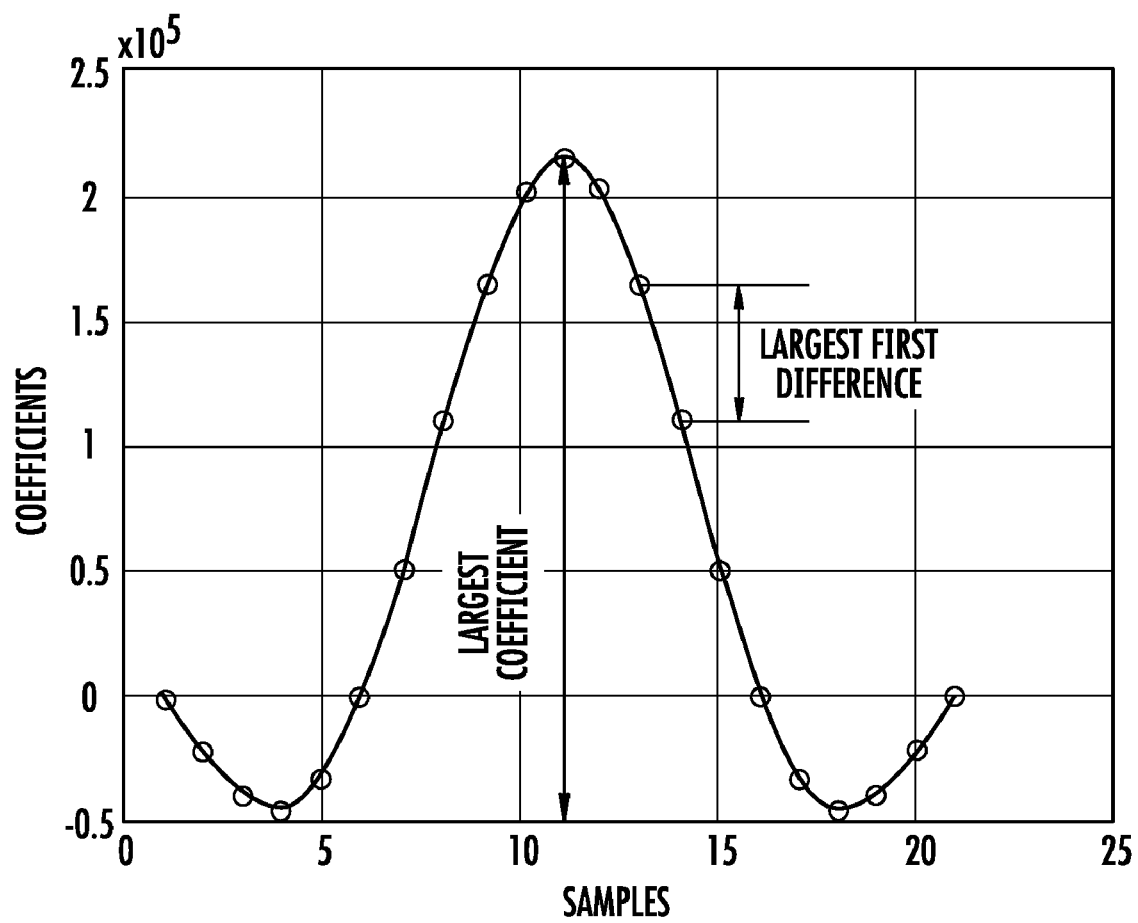
FIG. 1 is a graph illustrating the difference between conventional coefficient storage and the storage of coefficient differences for an impulse response according to one embodiment of the present invention.

FIG. 1 is a graph illustrating the difference between conventional coefficient storage and the storage of coefficient differences for an impulse response according to the present invention. As shown in FIG. 1, the differences between two consecutive coefficients are much smaller than the coefficients themselves. For example, the largest coefficient is about four times larger than the largest first difference. This ratio is much larger for filters with large numbers of coefficients because filter coefficients are closely spaced giving smaller differences between consecutive coefficients.

Figure 2:
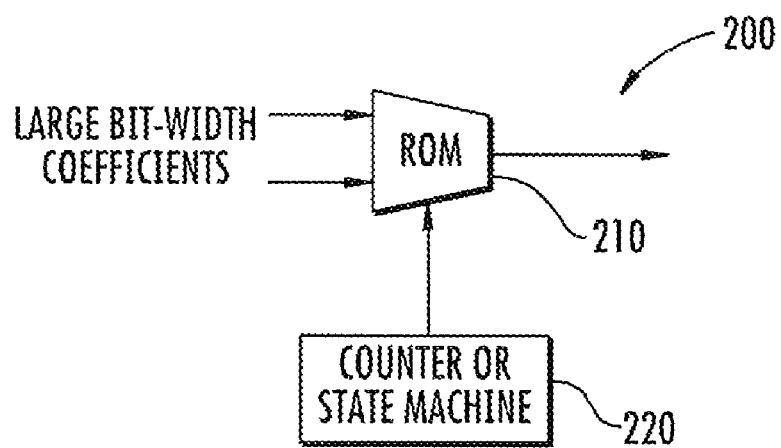
FIG. 2 shows a conventional prior art apparatus for coefficient storage.

FIG. 2 shows a conventional apparatus 200 for coefficient storage. The apparatus 200 includes a read only memory (ROM) 210 that stores large bit-width coefficients. A counter or state machine 220 can be operatively coupled to ROM 210 for clocking coefficient information into and out of the memory. The ROM 210 simply stores and outputs the coefficients.

Figure 3:
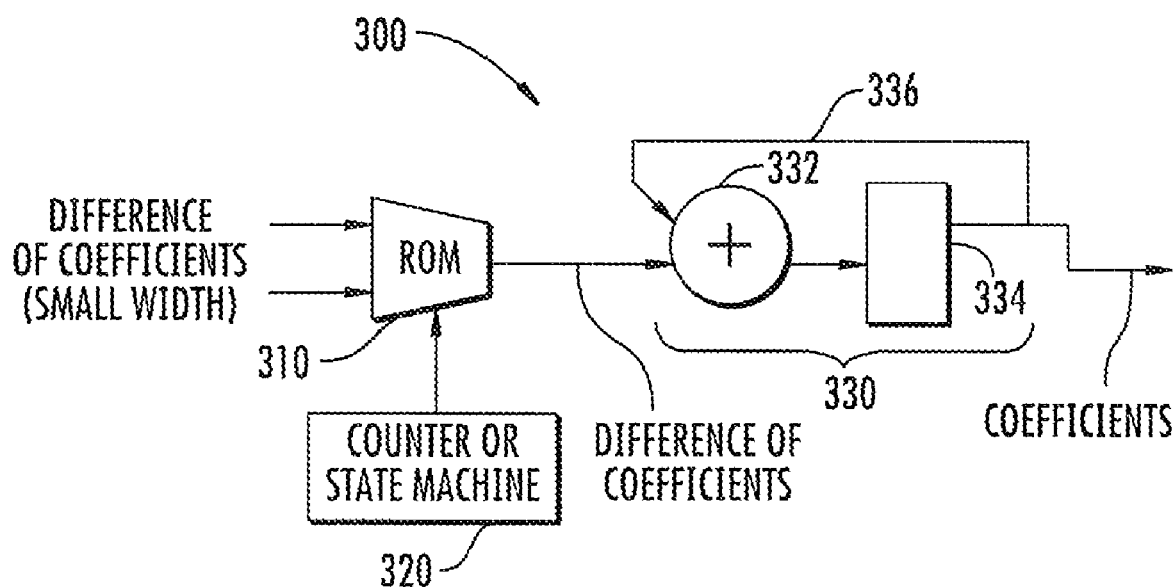
FIG. 3 depicts a system for coefficient compression and storage according to one embodiment of the present invention.

In a first approach of the present method for digital filter coefficient compression, a digital filter, such as an FIR filter, having a plurality of consecutive filter coefficients is provided. Consecutive difference values between each of the consecutive filter coefficients are determined, and data comprising a first filter coefficient and the consecutive difference values is stored in a memory. The consecutive filter coefficients are generated by retrieving the first filter coefficient, and adding a first difference value to the first filter coefficient to generate a consecutive second filter coefficient. A consecutive next difference value is then added to the second filter coefficient to generate a consecutive next filter coefficient, FIG. 3 depicts a system 300 for carrying out the first approach to digital filter coefficient compression/decompression according to one embodiment of the invention. The system 300 includes a memory device 310 such as a ROM that is configured to store and output difference values of coefficients (small width). A counter or state machine 320 is operatively coupled to memory device 310 for clocking coefficient difference information out of the memory device 310. An integrator 330 is operatively coupled to the output of memory device 310. The integrator 330 includes an adder 332 that receives data outputted from memory device 310, and a set of flip-flops 334 that receives data from adder 332 for generating coefficients. The integrator 330 converts the differences from memory 310 to actual coefficients as described in further detail hereafter.

The system 300 is operated to carry out the first approach to coefficient compression for a digital filter having a plurality of consecutive filter coefficients including a first filter coefficient. A plurality of consecutive difference values between each of the consecutive filter coefficients is determined, and data comprising the first filter coefficient and the consecutive difference values is stored in memory device 310. For example, a first difference value corresponds to a difference between the first filter coefficient and a consecutive second filter coefficient, and a consecutive next difference value corresponds to a difference between the second filter coefficient and a consecutive next filter coefficient.

In generating the consecutive filter coefficients using system 300, the first filter coefficient is outputted from memory device 310 to adder 332 and integrated and stored in flip-flops 334. The first filter coefficient is output from flip-flops 334 for further use in system 300, and is also returned to adder 332 in a feedback loop 336. A first difference value is then outputted from memory device 310 to adder 332, which combines the first difference value with the first filter coefficient to generate a consecutive second filter coefficient. The second filter coefficient is output from flip-flops 334 for further use, and is also returned to adder 332 in feedback loop 336. A consecutive next difference value is then outputted from memory device 310 to adder 332, which combines the next difference value with the feedback second filter coefficient to generate a consecutive next filter coefficient. The above procedure is repeated for each remaining consecutive difference value, which is added to a successively generated next filter coefficient to generate the remaining consecutive filter coefficients that are output from system 300.

An example of the first approach of the present method follows. Let $C_1, C_2, \ldots C_n$ be the consecutive coefficients to be generated. Instead of storing coefficients $C_1, C_2$, etc. as required in prior conventional techniques, the present method provides that only coefficient $C_1$ be stored. The difference values (D) between the consecutive coefficients are stored in memory as follows:

$$D_1 = C_2 - C_1$$

$$D_2 = C_3 - C_2, \text{ and so on.}$$

For digital filter execution, the coefficients $C_1, C_2, \ldots$ need to be generated in sequence. Each coefficient is derived from its previous coefficient by adding the corresponding difference. For example, $C_2$ can be derived using $(C_1 + D_1)$, $C_3$ can be derived using $(C_2 + D_2)$, and so on. The differences $D_1, D_2, \ldots$ require much smaller bit-width compared to $C_1, C_2 \ldots$, which results in a reduction of memory size. The following shows this feature. If the filter coefficients are 1, 0.8, 0.7, 0.65, and so on, then only 1, 0.2 (1−0.8), 0.1 (0.7−0.8), and so on, need to be stored. The stored numbers 0.2 and 0.1 are much smaller compared to the original coefficients.

In a second approach of the present method for digital filter coefficient compression, a digital filter, such as an FIR filter, having a plurality of consecutive filter coefficients is provided. Consecutive first difference values between each of the consecutive filter coefficients are determined, and consecutive second difference values between each of the first difference values are determined and stored in a memory. The second difference values are used to derive the first difference values, and the first difference values are then used to derive the actual coefficients. The second approach reduces the memory bit-width even further than the first approach of the present method, though the second approach does require additional hardware components.

Figure 4:
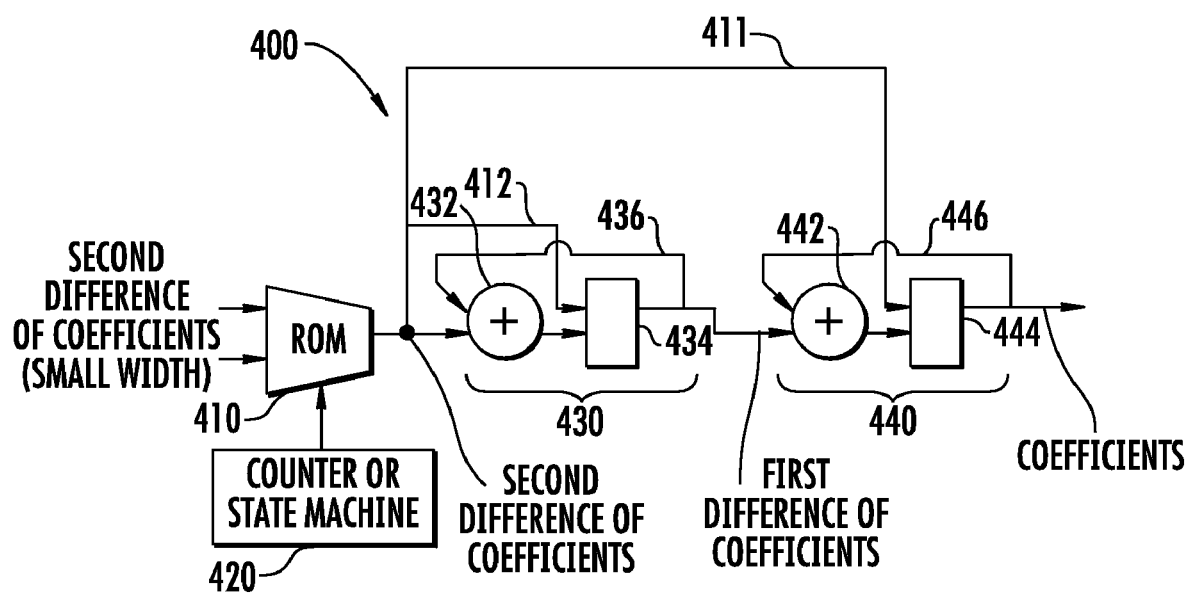
FIG. 4 depicts a system for coefficient compression and storage according to another embodiment of the present invention.

FIG. 4 depicts a system 400 for carrying out the second approach to digital filter coefficient compression according to another embodiment of the invention. The system 400 includes a memory device 410 such as a ROM that is configured to store and output the second difference values (small width). A counter or state machine 420 is operatively coupled to memory device 410. A first integrator 430 is operatively coupled to the output of memory 410. The first integrator 430 includes an adder 432, which receives data outputted from memory device 410, and a first set of flip-flops 434 that receives data from adder 432. A feedback loop 436 connects an output of flip-flops 434 with an input of adder 432. A second integrator 440 is operatively coupled to the output of the first integrator 430. The second integrator 440 includes an adder 442, which receives data outputted from first integrator 430, and a second set of flip-flops 444 that receives data from adder 442. A feedback loop 446 connects an output of flip-flops 444 with an input of adder 442.

The first integrator 430 converts the second difference values from memory 410 to corresponding first difference values between the coefficients. The second integrator 440 converts the first difference values output from first integrator 430 to actual coefficients as described in further detail hereafter.

The following exemplary parameters are used to describe the operation of system 400 to carry out the second approach to coefficient compression. The filter coefficients are 1.0, 0.8, 0.7, 0.65, etc., the first difference values between the coefficients are −0.2, −0.1, −0.05, etc, and the second difference values between each of first difference values are 0.1, 0.05, etc. It should be understood that other filter coefficients can be used in the present system.

In operating system 400 using the above parameters, data comprising a first filter coefficient (1.0), an initial first difference value between the first filter coefficient and a consecutive next filter coefficient (−0.2), and the consecutive second difference values (0.1, 0.05, etc.) are stored in memory device 410. In a first initialization step, the first filter coefficient (1.0) is loaded into the second integrator's flip-flops 444 directly from memory 410 over a transmit line 411. The initial first difference value (−0.2) is loaded into the first integrator's flip-flops 434 directly from memory 410 over a transmit line 412. The first filter coefficient is available for the system to use. At the end of initialization, the output of second integrator 440 is 1.0 (initial coefficient) and that of first integrator 430 is −0.2 (initial first difference). The output of memory 410 is 0.1 (initial second difference).

In a second step during a first clock cycle, the second integrator 440 adds the initial first difference of −0.2, coming from the output of first integrator 430, to its own output 1.0, producing an output of 1.0−0.2=0.8. Then the first integrator 430 adds the second difference value of 0.1, coming from memory 410, to its own output of −0.2, producing an output of −0.2+0.1=−0.1. The memory 410 will also move to its next location producing an output of 0.05, which is the next second difference. At the end of the first clock cycle, the output of second integrator 440 is 0.8, the output of first integrator 430 is −0.1, and the output of memory 410 is 0.05.

In a third step during a second clock cycle, the second integrator 440 adds the next first difference of −0.1, coming from the output of first integrator 430, to its own output of 0.8, producing an output of 0.8−0.1=0.7. Then the first integrator 430 adds the second difference value of 0.05, coming from memory 410, to its own output of −0.1, producing and output −0.1+0.05=−0.05. At the end of the second clock cycle, the output of second integrator 440 is 0.7, the output of first integrator 430 is −0.05, and the output of memory 410 is the next second difference (not used in this example).

The foregoing procedure can be repeated for any remaining consecutive second difference values, which are used by first integrator 430 to derive additional successive first difference values. The derived first difference values are then used by second integrator 440 to derive further consecutive filter coefficients that are output from system 400.

Figure 5:
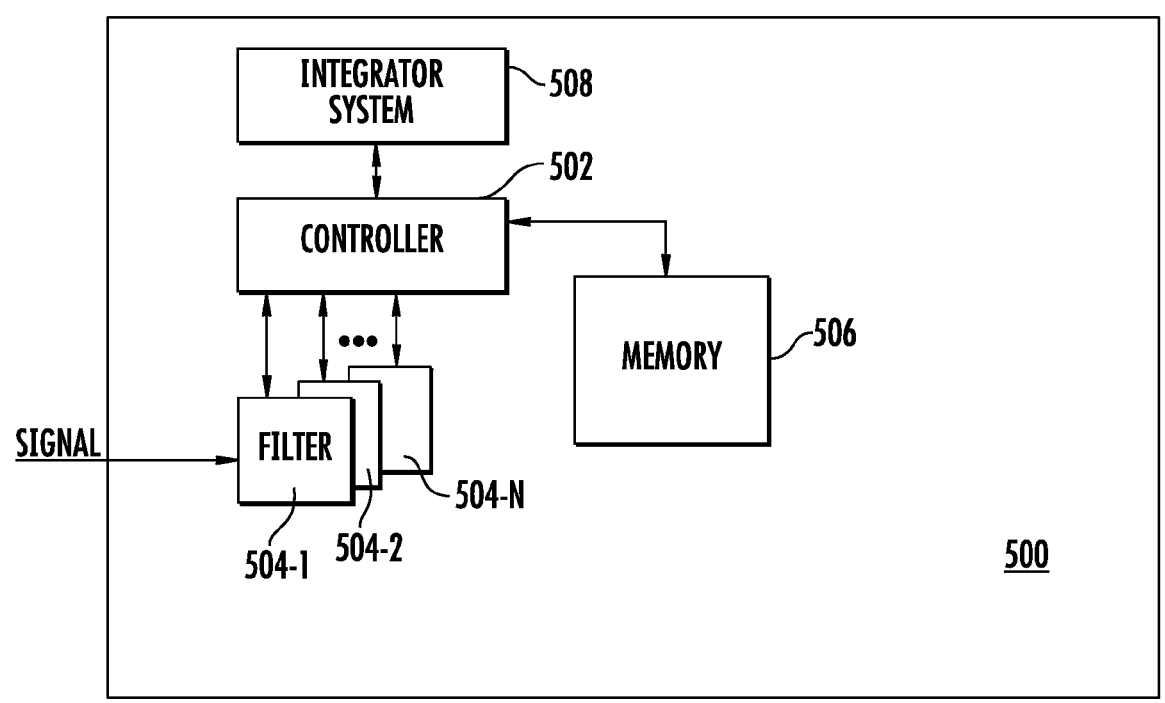
FIG. 5 is a block diagram illustrating a digital signal processing system according to one embodiment of the present invention.

Referring to FIG. 5, a high precision DSP system 500 according to one embodiment of the present invention is illustrated. The DSP system 500 includes a controller 502, a plurality of digital filters 504-1, 504-2, . . . 504-N, a memory device 506 and an integrator system 508. In one embodiment, the filters 504-1 to 504-N are finite impulse response filters. The controller 502 is operatively coupled to memory device 506 and the digital filters. The controller 502 is operative to control the retrieval of data from memory device 506 for the filters. The integrator system 508 is operatively coupled to controller 502 and implements the coefficient compression techniques discussed previously.

In one embodiment, the integrator system 508 includes a single integrator to determine coefficients from first difference values as discussed above in regard to FIG. 3. In another embodiment, the integrator system 508 includes a first integrator to determine first difference values from second difference values, and also includes a second integrator to determine coefficients from the first difference values as discussed above in regard to FIG. 4. In other embodiments, integrator system 508 can use additional integrators such as a third integrator.

The present method was applied to an FIR filter for a 16 bit sigma-delta converter that was required to store 2000 coefficients. A simple prior art ROM approach (e.g., FIG. 2) takes more than 200 K $\mu m^2$ of memory area in 0.35 $\mu m$ technology. Using embodiments of the present invention, such as described above, a memory area of less than about 100 K $\mu m^2$ was achieved. Not only do the present techniques allow for a reduced memory area, the present techniques also reduce routing congestion, resulting in further memory area saving.

Hence, embodiments of the present invention reduce the coefficient storage requirements in FIR filters. Higher order differences (e.g., second difference values between first differences) can be utilized to further reduce the storage area, but this increases the hardware overhead. Practically, second or third order differences give the maximum area benefit for filters that have a few thousand coefficients. For storing higher order differences, the hardware required to recover the coefficients starts increasing the area requirements and thus is less beneficial.

The techniques of the present invention as described above can be implemented in digital electronic circuitry, or with a programmable processor (for example, a special-purpose processor or a general-purpose processor such as a computer), firmware, software, or combinations thereof. Apparatus embodying these techniques may include appropriate input and output devices, a programmable processor, and computer readable storage media tangibly embodying program instructions for execution by the programmable processor. A process embodying these techniques may be performed by a programmable processor executing a program of instructions to perform desired functions by operating on input data and generating appropriate output. The instructions on a computer readable medium can be in the form of program modules or applications including routines, objects, data components, data structures, algorithms, and the like, which perform particular tasks or implement particular abstract data types.

Suitable computer readable media may comprise, for example, non-volatile memory devices including semiconductor memory devices such as EPROM, EEPROM, or flash memory devices; magnetic disks such as internal hard disks or removable disks; magneto-optical disks; CDs, DVDs, or other optical storage disks; nonvolatile ROM, RAM, and other like media; or any other media that can be used to carry or store desired program code in the form of computer executable instructions or data structures. Any of the foregoing may be supplemented by, or incorporated in, specially-designed application-specific integrated circuits (ASICs), or field programmable gate arrays (FPGAs). When information is transferred or provided over a network or another communications connection (either hardwired, wireless, or a combination of hardwired or wireless) to a computer, the computer properly views the connection as a computer readable medium. Thus, any such connection is properly termed a computer readable medium. Combinations of the above are also included within the scope of computer readable media.

Although specific embodiments have been illustrated and described herein, it will be appreciated by those of ordinary skill in the art that any arrangement, which is calculated to achieve the same purpose, may be substituted for the specific embodiment shown. The scope of the invention is therefore indicated by the appended claims rather than by the foregoing description. All changes that come within the meaning and range of equivalency of the claims are to be embraced within their scope.

What is claimed is:

1. A method for compressing coefficients of a digital filter, the method comprising:
   providing a digital filter having a plurality of consecutive filter coefficients including a first filter coefficient;
   determining consecutive first difference values between each of the consecutive filter coefficients;
   determining consecutive second difference values between each of the consecutive first difference values, the consecutive second difference values including an initial second difference value; and
   storing data in a memory, the data comprising:
      the first filter coefficient;
      an initial first difference value between the first filter coefficient and a consecutive next filter coefficient; and
      the consecutive second difference values.

2. The method of claim 1, further comprising:
generating the consecutive filter coefficients from the data stored in the memory by a technique comprising:
outputting the first filter coefficient from the memory;
outputting the initial first difference value from the memory;
adding the initial second difference value to the initial first difference value to derive a successive first difference value;
adding the successive first difference value to the initial first difference value to derive the consecutive next filter coefficient;
deriving additional successive first difference values from remaining consecutive second difference values; and
deriving further consecutive filter coefficients from the derived first difference values.

3. The method of claim 1, wherein the digital filter comprises a finite impulse response filter.

4. A system for digital filter coefficient compression, the system comprising:
at least one memory device configured for storing and outputting data for at least one digital filter having a plurality of consecutive filter coefficients, the data comprising:
a first filter coefficient of the digital filter;
an initial difference value of a plurality of consecutive first difference values corresponding to differences between each of the consecutive filter coefficients, the initial difference value corresponding to a difference between the first filter coefficient and a consecutive next filter coefficient; and
a plurality of consecutive second difference values corresponding to differences between each of the consecutive first difference values;
a first integrator operatively coupled to an output of the memory device, the first integrator configured to convert each of the consecutive second difference values from the memory device to a corresponding consecutive first difference value; and
a second integrator operatively coupled to an output of the first integrator, the second integrator configured to convert each of the consecutive first difference values from the first integrator to a corresponding consecutive filter coefficient.

5. The system of claim 4, wherein the at least one digital filter comprises a finite impulse response filter.

6. The system of claim 4, further comprising:
a counter or state machine operatively coupled to the memory device and configured to clock consecutive second difference values into and out of the memory device.

7. The system of claim 4, wherein the memory device is a read only memory.

8. The system of claim 4, further comprising a controller operatively coupled to the at least one digital filter.

9. A digital signal processing system, comprising:
one or more digital filters configured to receive a signal and having a plurality of consecutive filter coefficients including a first filter coefficient;
at least one controller operatively coupled to the one or more digital filters;
at least one memory device configured for storing and outputting data for the digital filters in response to instructions from the controller, the data comprising:
a first filter coefficient of the digital filter;
an initial difference value of a plurality of consecutive first difference values corresponding to differences between each of the consecutive filter coefficients, the initial difference value corresponding to a difference between the first filter coefficient and a consecutive next filter coefficient; and
a plurality of consecutive second difference values corresponding to differences between each of the consecutive first difference values; and
an integrator system operatively coupled to the controller, the integrator system comprising:
a first integrator configured to convert each of the consecutive second difference values from the memory device into a corresponding consecutive first difference value; and
a second integrator operatively coupled to an output of the first integrator and configured to convert each of the consecutive first difference values from the first integrator to a corresponding consecutive filter coefficient.

10. The system of claim 9, wherein the one or more digital filters comprise one or more finite impulse response filters.

* * * * *